(12) United States Patent
Kuwajima

(10) Patent No.: US 9,209,123 B2
(45) Date of Patent: Dec. 8, 2015

(54) SEMICONDUCTOR DEVICE AND METHOD OF MANUFACTURING THE SAME

(71) Applicant: RENESAS ELECTRONICS CORPORATION, Kanagawa (JP)

(72) Inventor: Teruhiro Kuwajima, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/508,776

(22) Filed: Oct. 7, 2014

(65) Prior Publication Data
US 2015/0108655 A1    Apr. 23, 2015

(30) Foreign Application Priority Data
Oct. 21, 2013    (JP) .................................. 2013-218037

(51) Int. Cl.
| | |
|---|---|
| H01L 23/48 | (2006.01) |
| H01L 21/4763 | (2006.01) |
| H01L 23/498 | (2006.01) |
| H01L 21/768 | (2006.01) |

(52) U.S. Cl.
CPC .... *H01L 23/49827* (2013.01); *H01L 21/76802* (2013.01)

(58) Field of Classification Search
USPC .................. 257/758, 774, E21.596, E21.597, 257/E23.142, E23.145; 438/622, 623, 629, 438/668, 630, 637–640, 672, 675
See application file for complete search history.

(56) References Cited

U.S. PATENT DOCUMENTS

| | | | |
|---|---|---|---|
| 7,514,355 B2 | 4/2009 | Katase et al. | |
| 7,834,459 B2 * | 11/2010 | Kageyama | .................... 257/773 |
| 7,936,072 B2 | 5/2011 | Takewaki | |
| 2004/0119164 A1 * | 6/2004 | Kurashima et al. | ........... 257/758 |
| 2005/0116333 A1 * | 6/2005 | Akiyama | ..................... 257/698 |

FOREIGN PATENT DOCUMENTS

| | | |
|---|---|---|
| JP | 2006-13078 A | 1/2006 |
| JP | 2009-141334 A | 6/2009 |

* cited by examiner

*Primary Examiner* — Jasmine Clark
(74) *Attorney, Agent, or Firm* — McDermott Will & Emery LLP

(57) ABSTRACT

Both enhancement of embeddability of a wiring groove and suppression of the generation of a coupling failure between a wiring and a coupling member are simultaneously achieved. In a cross-section perpendicular to a direction passing through the contact and a direction in which the second wiring extends, the center of the contact is more close to a first side surface of the second wiring than the center of the second wiring. In addition, when a region where the first side surface of the second wiring overlaps the contact in the direction in which the second wiring extends, is set to be an overlapping region, at least the lower part of the overlapping region has an inclination steeper than that of other portions of the side surface of the second wiring.

8 Claims, 20 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2013-218037 filed on Oct. 21, 2013 including the specification, drawings and abstract is incorporated herein by reference in its entirety.

BACKGROUND

The present invention relates to a semiconductor device and a method of manufacturing the same, and for example, to a technology that can be applied to a semiconductor device having a structure in which a first wiring and a second wiring are coupled by using a coupling member.

The semiconductor device has a multilayer wiring structure in order to route wirings. In addition, a first wiring located in a relatively low layer and a second wiring located in a layer that is higher than the low layer are coupled to each other via a coupling member such as a via or a contact.

For example, Japanese Patent Laid-Open No. 2006-13078 (Patent Literature 1) describes that the via is extended obliquely.

Furthermore, Japanese Patent Laid-Open No. 2009-141334 (Patent Literature 2) describes that the inclination of a part of the side surface of the via is made more gradual than that of other portions of the side surface of the via.

SUMMARY

In recent years, miniaturization of the semiconductor device has been in progress, and thus the width of the upper surface of the wiring groove becomes narrower. When the width of the upper surface of the wiring groove becomes narrow, it becomes hard to embed a conductor in the wiring groove. In order to make it easier to embed a conductor in the wiring groove, it is recommended that the inclination of the side surface of the wiring groove be gradual. However, when the inclination of the side surface of the wiring groove is made gradual, the bottom surface of the wiring groove becomes narrower and it becomes more likely that a coupling failure is generated between the coupling member such as a via and a contact, and the wiring. As described above, it has been difficult to simultaneously achieve both enhancement of embeddability of the wiring groove and suppression of the generation of a coupling failure between the wiring and the coupling member. The other tasks and the new feature will become clear from the description of the present specification and the accompanying drawings.

According to an embodiment, a first interlayer insulating film is formed over a first wiring. A coupling hole is formed in the first interlayer insulating film and located over the first wiring. A coupling member is embedded in the coupling hole and formed of an electrically conductive material. A second interlayer insulating film is located over the coupling member and over the first interlayer insulating film. A wiring groove is formed in the second interlayer insulating film and overlaps the coupling member in a planar view. A second wiring is embedded in the wiring groove and in a cross-section perpendicular to a direction passing through the coupling member and a direction in which the second wiring extends, the center of the coupling member is more close to a first side surface of the second wiring than the center of the second wiring. In addition, when the region where the first side surface of the second wiring overlaps the coupling member in the direction in which the second wiring extends, is set to be an overlapping region, at least the lower part of the overlapping region has an inclination steeper than that of other portions of the side surface of the second wiring.

According to the embodiment, it is possible to simultaneously achieve both enhancement of embeddability of the wiring groove and suppression of the generation of a coupling failure between the wiring and the coupling member.

DETAILED DESCRIPTION

Hereinafter, embodiments are explained by using drawings. In all the drawings, the same symbols are attached to the same components and explanation is omitted appropriately.

(First Embodiment)

Figure 1:
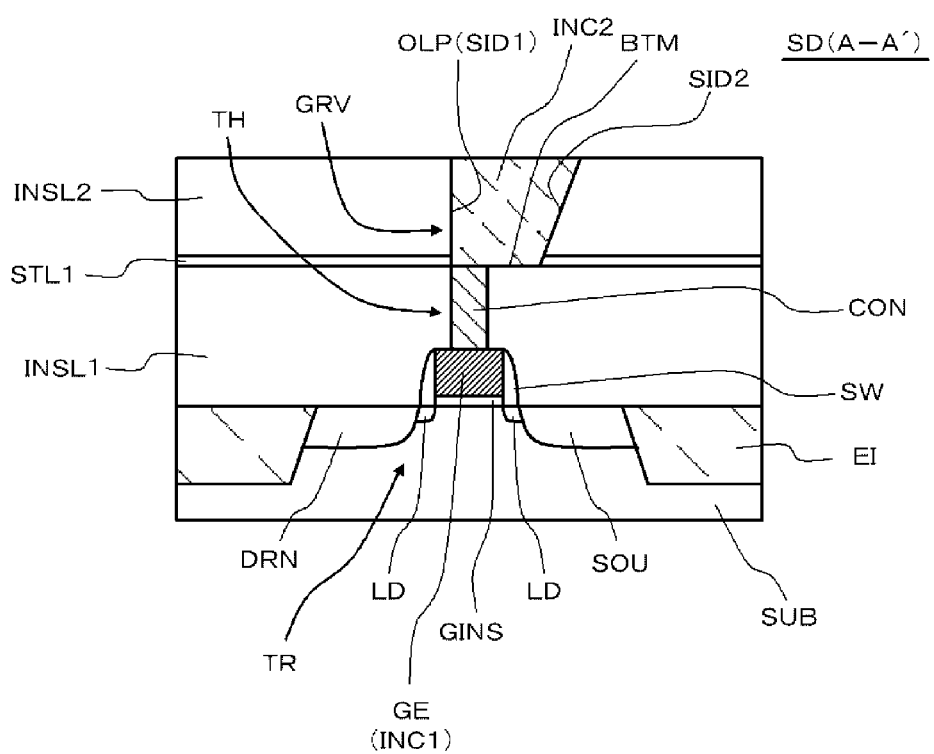
FIG. 1 is a cross-sectional view illustrating a configuration of a semiconductor device according to a First Embodiment.

FIG. 1 is a cross-sectional view illustrating a configuration of a semiconductor device SD according to a First Embodiment. The semiconductor device SD according to the present embodiment includes a-gate electrode GE (first wiring). a first interlayer insulating film INSL1, a coupling hole TH, a contact CON (coupling member), a second interlayer insulating film INSL2, a wiring groove GRV, and a second wiring INC2. The first interlayer insulating film INSL1 is formed over the gate electrode GE. The coupling hole TH is formed in the first interlayer insulating film INSL1 and located over the gate electrode GE. The contact CON is embedded in the coupling hole TH and formed of an electrically conductive material. The second interlayer insulating film INSL2 is located over the contact CON and over the first interlayer insulating film INSL1. The wiring groove GRV is formed in the second interlayer insulating film INSL2 and overlaps the contact CON in a plan view. The second wiring INC2 is embedded in the wiring groove GRV. In across-section perpendicular to a direction passing through the contact CON and a direction in which the second wiring INC2 extends, the center of the contact CON is more close to a first side surface SIM of the second wiring INC2 than the center of the second wiring INC2. In addition, when a region where the first side surface SID1 of the second wiring INC2 overlaps the contact CON in the direction in which the, second wiring INC2 extends, is set to be an overlapping region OLP, at least the lower part of the overlapping region OLP has an inclination steeper than that of other portions of the side surface of the second wiring INC2. In the example illustrated in FIG. 1, in the entire overlapping region OLP, the inclination is steep. Hereinafter. detailed explanation will be given.

In the example illustrated in FIG. 1, the semiconductor device SD is formed by using a substrate SUB. The substrate SUB is, for example, a semiconductor substrate such as s silicon substrate. In the substrate SUB, an element isolation film EI and a transistor TR are formed. The element isolation film EI surrounds the transistor TR. Namely, the element isolation film EI separates the transistor TR from other regions. The element isolation film EI is formed by using, for example, the Shallow Trench Isolation (STI) method, but may also be formed by using the LOCOS oxidation method.

The transistor TR has a gate insulting film GINS, the gate electrode GE, a sidewall SW, a source SOU, and a drain DRN.

The gate insulating film GINS is a film obtained by, for example, thermally oxidizing the substrate SUB. However, the gate insulating film GINS may be a film deposited over the substrate SUB. The gate electrode GE is formed over the gate insulting film GINS. The gate electrode GE is formed by, for example, polysilicon. However, at least a part of the layer of the gate electrode GE may be formed by metal. The sidewall SW is formed by at least one layer insulating film, for example, at least one of a silicon oxide film, a silicon nitride film, and a silicon oxynitride film, and covers the two side surfaces of the gate electrode GE. Meanwhile, a part of the gate electrode GE extends over the element isolation film EI.

The source SOU and the drain DRN are formed by implanting impurities into the substrate SUB. In addition, the source SOU and the drain DRN have a low-concentration region LD. The low-concentration region LD is located under the sidewall SW. The source SOU the drain DRN, and the low-concentration region LD have the same electrical conduction type (for example, n type or p type).

Over the element isolation film EI and over the transistor TR, the first interlayer insulating film INSL1 is formed. The first interlayer insulating film INSL1 is formed by, for example, a material (low dielectric constant material) whose dielectric constant is lower than that of silicon oxide. The first interlayer insulating film INSL1 may be a porous insulating film. Meanwhile, the first interlayer insulating film INSL1 may be a silicon oxide film.

The coupling hole TH is formed in the first interlayer insulating film INSL1. The coupling hole TH is located over the gate electrode GE. In addition, in the coupling hole TH, the contact CON is embedded. The contact CON is formed by, for example, W. However, the contact CON may be formed by another metal. In the example illustrated in FIG. 1, the contact CON is located over the portion of the gate electrode GE that forms the transistor TR. However, the contact CON may be formed over the portion of the gate electrode GE located over the element isolation film EI.

Over the first interlayer insulating film INSL1 and over the contact CON, an etching stopper film STL and the second interlayer insulating film INSL2 are formed in this order. The etching stopper film STL is formed by a material whose etching selection ratio is larger than that of the second interlayer insulating film INSL2. Namely, the etching rate of the etching stopper film STL is lower than that of the second interlayer insulating film INSL2 under the conditions of etching the second interlayer insulating film INSL2. Therefore, the etching stopper film STL functions as an etching stopper when forming the wiring groove GRV in the second interlayer insulating film INSL2. The etching stopper film STL is formed by, for example, SiCN or SiN. Furthermore, the second interlayer insulating film INSL2 is formed by, for example, a material (low dielectric constant material) whose dielectric constant is lower than that of silicon oxide. The second interlayer insulating film INSL2 may be a porous insulating film. Further, the second interlayer insulating film INSL2 may be a silicon oxide film.

The wiring groove GRV is formed in the second interlayer insulating film INSL2. The wiring groove GRV extends, for example, linearly. The second wiring INC2 is embedded in the wiring groove GRV. The second wiring INC2 is, for example, a copper wiring. At the bottom surface of the wiring groove GRV, the upper surface of the first interlayer insulating film INSL1 and the upper surface of the contact CON are located. In addition, the contact CON is coupled to a bottom surface BTM of the second wiring INC2. As described above, the contact CON and the second wiring INC2 have the single damascene structure.

Figure 2:
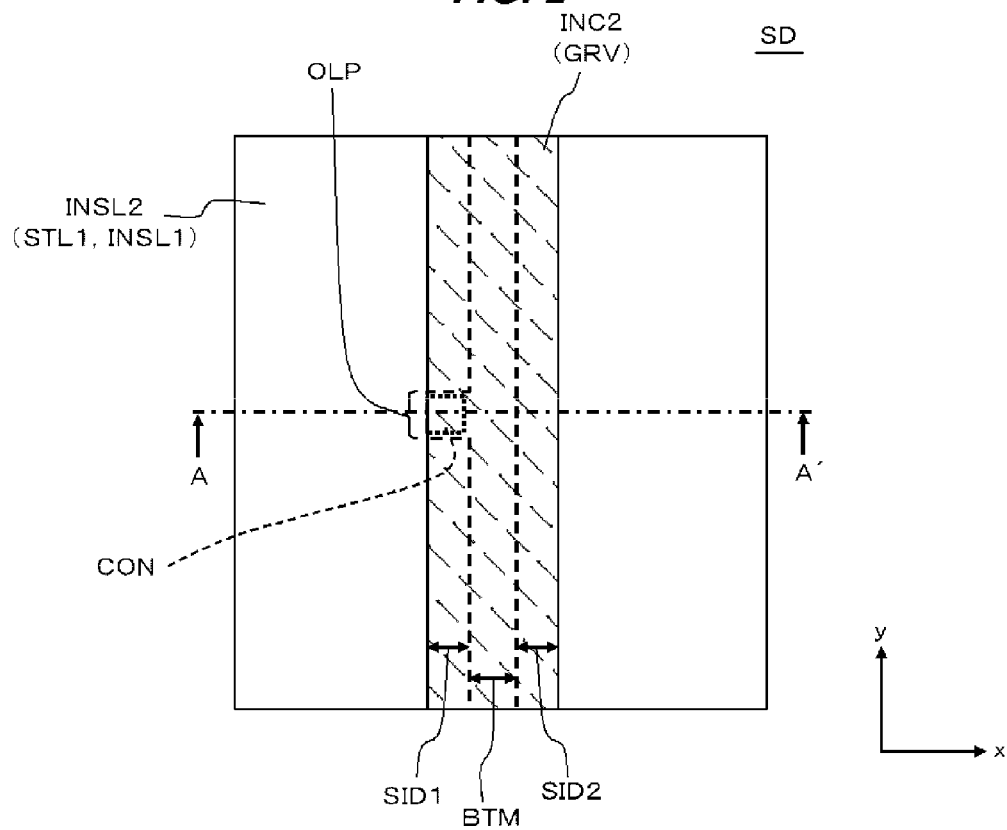
FIG. 2 is a plan view of a semiconductor device.

FIG. 2 is a plan view of the semiconductor device SD. FIG. 1 corresponds to A-A' cross-section in FIG. 2. As illustrated in FIG. 1 and FIG. 2, the second wiring INC2 has the first side surface SID1 and a second side surface SID2. Both of the two side surfaces extend in a direction in which the second wiring INC2 extends (y-direction in FIG. 2). In addition, the first side surface SID1 and the second side surface SID2 have the same inclination except in the overlapping region OLP of the first side surface SID1. Then, as illustrated in FIG. 1, the overlapping region OLP of the first side surface SID1 has an inclination steeper than that of the second side surface SID2. Because of this, as illustrated in FIG. 2, the region of the bottom surface BTM overlapping the contact CON, of the second wiring INC2 has a width greater than that of other portions of the bottom surface BTM. Because of this, the possibility of causing a coupling failure between the contact CON and the second wiring INC2 is reduced.

FIG. 3 to FIG. 14 are each a cross-sectional view for explaining a method of manufacturing the semiconductor device SD illustrated in FIGS. 1 and 2, and correspond to the A-A' cross-section in FIG. 2.

Figure 3:
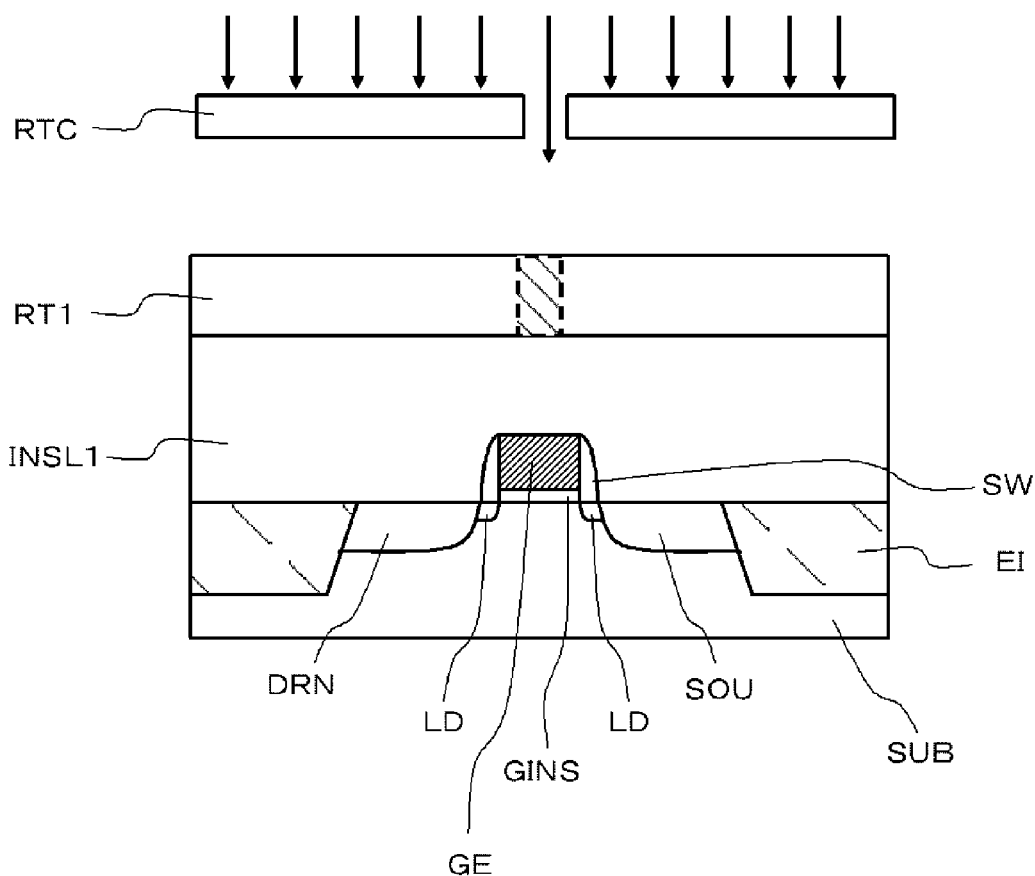
FIG. 3 is a cross-sectional view for explaining a method of manufacturing a semiconductor device.

First, as illustrated in FIG. 3, the element isolation film EI is formed on the substrate SUB. Because of this, the region (element formation region) in which the transistor TR is formed is isolated. Next, the gate insulating film GINS and the gate electrode GE are formed on the substrate SUB located in the element formation region. The gate insulating film GINS may be a silicon oxide film or a high dielectric constant film (for example, hafnium silicate film) whose dielectric constant is higher than that of the silicon oxide film. In the case where the gate insulating film GINS is a silicon oxide film, the gate electrode GE is formed by a polysilicon film. Furthermore, in the case where the gate insulating film GINS is a high dielectric constant film, the gate electrode GE is formed by a stacked film of a metal film (for example, TiN) and a polysilicon film. Moreover, in the case where the gate electrode GE is formed by polysilicon, in the process for forming the gate electrode GE, a polysilicon resistor may be formed over the element isolation film EI.

Next, the low-concentration region LDD is formed on the substrate SUB located in the element formation region. Subsequently, the sidewall SW is formed on the sidewall of the gate electrode GE. Then, in the substrate SUB located in the element formation region, impurity regions serving as the source SOU and the drain DRN are formed. In this manner, the transistor TR is formed over the substrate SUB.

Next, over the element isolation film EI and over the transistor TR, the first interlayer insulating film INSL1 is formed by using, for example, the plasma CVD method. Subsequently, a resist film RT1 is formed over the first interlayer insulating film INSL1. After that, the resist film RT1 is exposed by using a reticle RTC.

Figure 4:
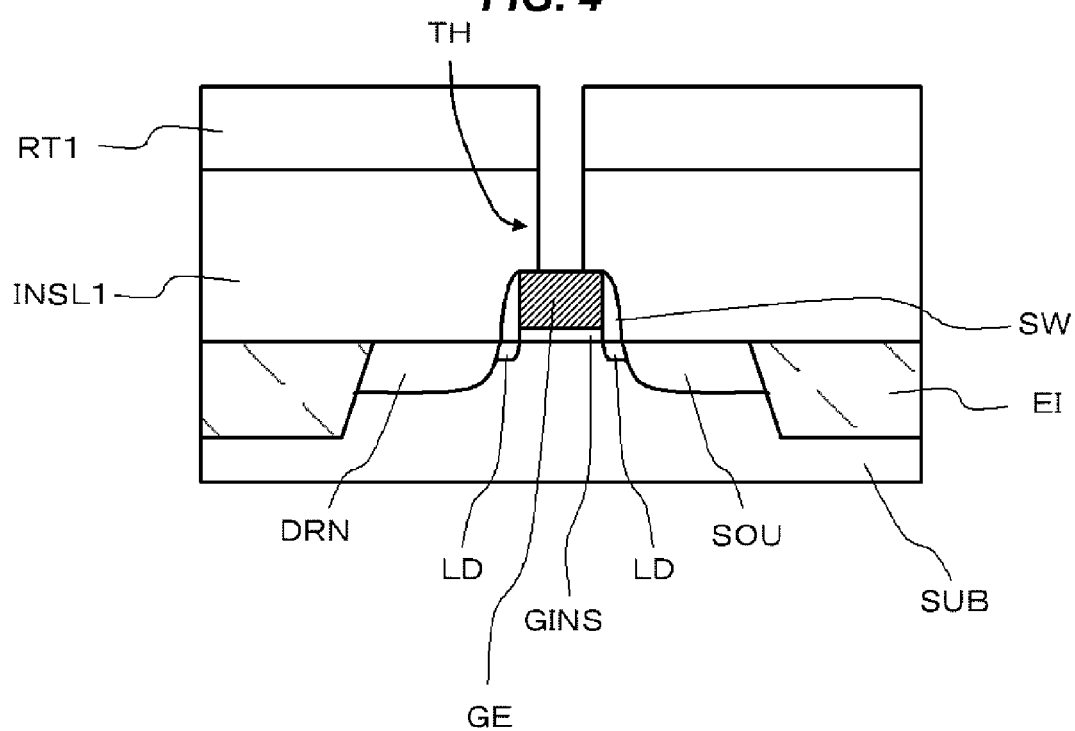
FIG. 4 is a cross-sectional view for explaining the method of manufacturing the semiconductor device.

Next, as illustrated in FIG. 4, the resist film RT1 is developed. Because of this, an opening is formed in the resist film RT1. Then, the first interlayer insulating film INSL1 is etched by using the resist film RT1 as a mask. Therefore, the coupling hole TH is formed in the first interlayer insulating film INSL1.

Figure 5:
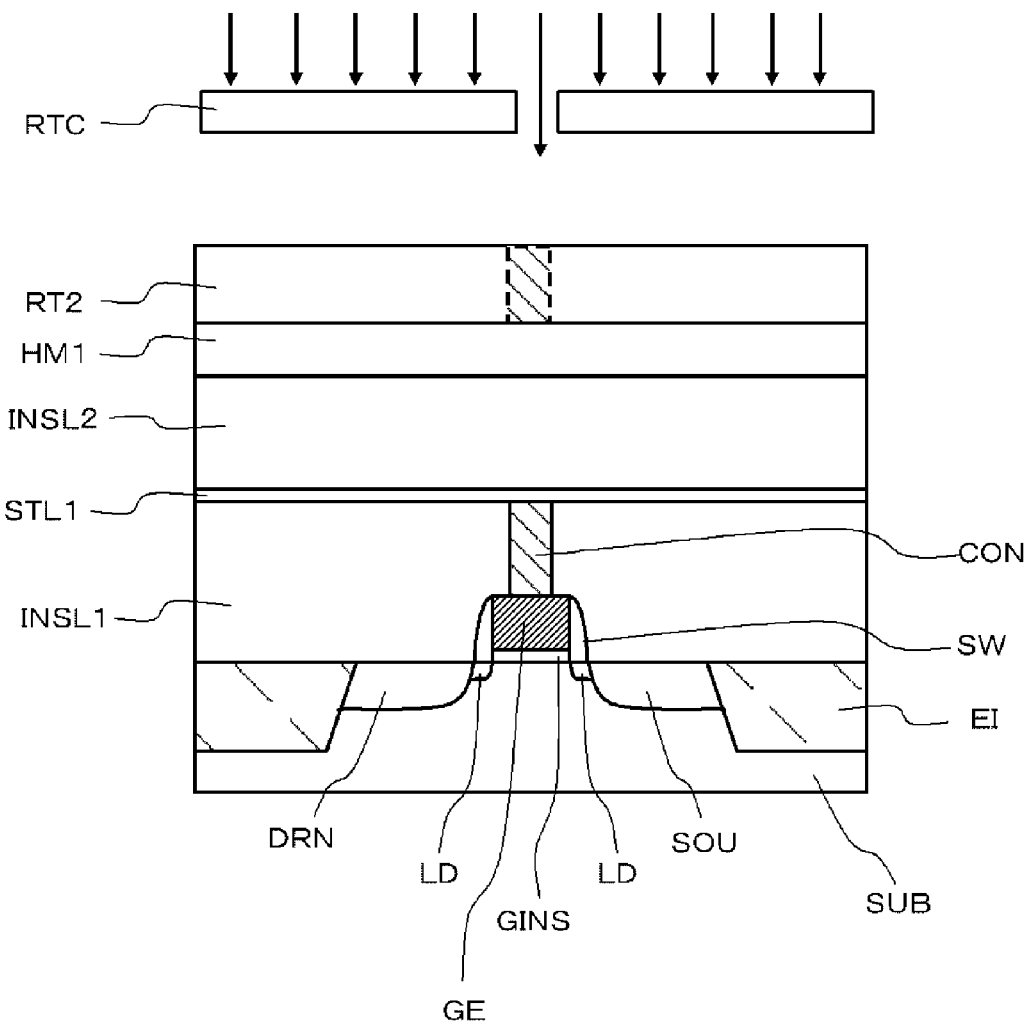
FIG. 5 is a cross-sectional view for explaining the method of manufacturing the semiconductor device.

After that, the resist film RT1 is removed. Next, as illustrated in FIG. 5, the contact CON is embedded within the coupling hole TH. The contact CON is formed, for example, as follows. First, within the coupling hole TH and over the first interlayer insulating film INSL1, a conductive film (for example, W film) serving as the contact CON is formed. Subsequently, the conductive film located over the first interlayer insulating film INSL1 is removed by, for example, the CMP method or the etch-back method. In this manner, the contact CON is embedded within the coupling hole TH.

After that, an etching stopper film STL1 and the second interlayer insulating film INSL2 are formed over the contact CON in this order. The etching stopper film STL1 and the second interlayer insulating film INSL2 are formed by using, for example, the plasma CVD method.

Next, a hard mask HM1 is formed over the second interlayer insulating film INSL2. Subsequently, a resist film RT2 is formed over the hard mask HM1. Then, the resist film RT2 is exposed by using the reticle RTC. The reticle RTC is the same as the reticle RTC used when forming the coupling hole TH.

Figure 6:
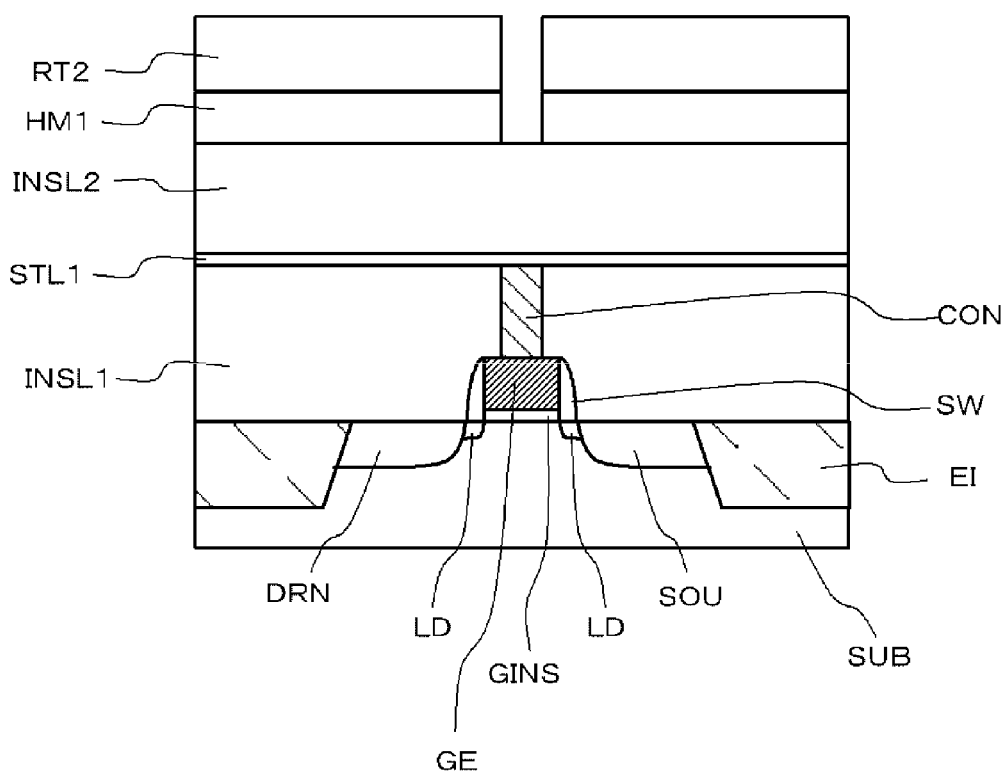
FIG. 6 is a cross-sectional view for explaining the method of manufacturing the semiconductor device.

Next, as illustrated in FIG. 6, the resist film RT2 is developed. Because of this, in the resist film RT2, an opening is formed. At least a part of this opening overlaps the contact CON in a planar view. Subsequently, the hard mask HM1 is etched by using the resist film RT2 as a mask. Therefore, an opening is formed in the hard mask HM1.

Figure 7:
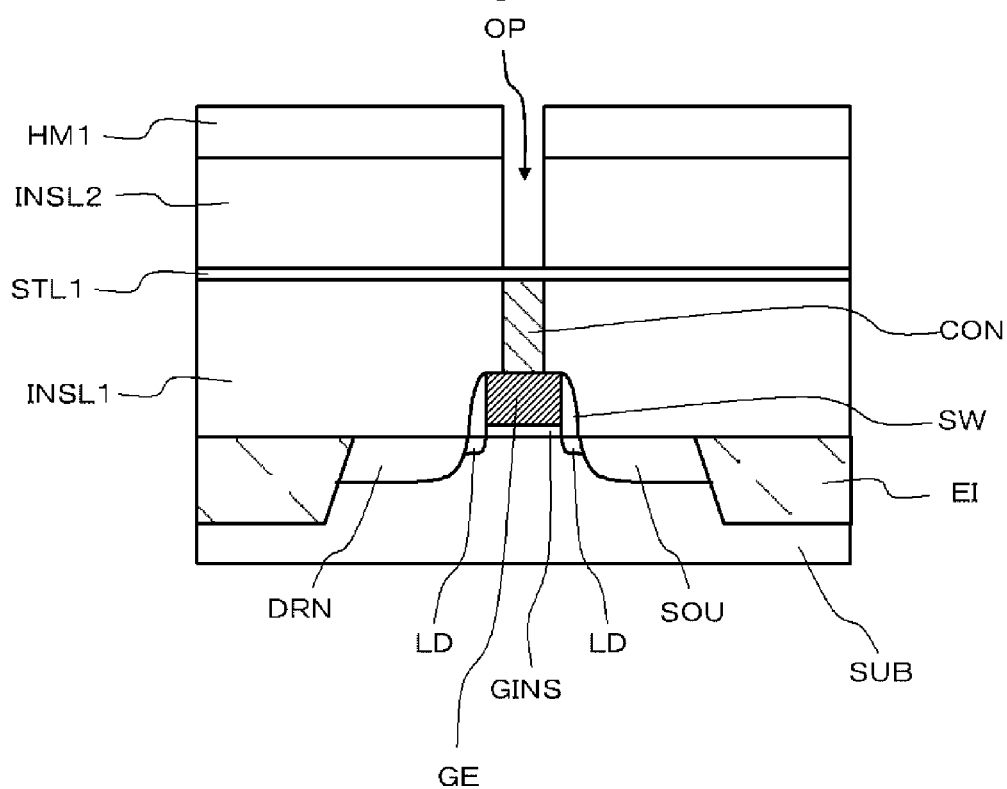
FIG. 7 is a cross-sectional view for explaining the method of manufacturing the semiconductor device.

Next, as illustrated in FIG. 7, by using the resist film RT2 and the hard mask HM1 as a mask, the second interlayer insulating film INSL2 is dry-etched. At this time, the etching stopper film STL1 functions as an etching stopper. Because of this, an opening OP is formed in the second interlayer insulating film INSL2. The opening OP overlaps the contact CON in a planar view. Furthermore, the opening OP penetrates through the second interlayer insulating film INSL2, but does not penetrate through the etching stopper film STL1. Meanwhile, in this process, most of the resist film RT2 is removed.

Figure 8:
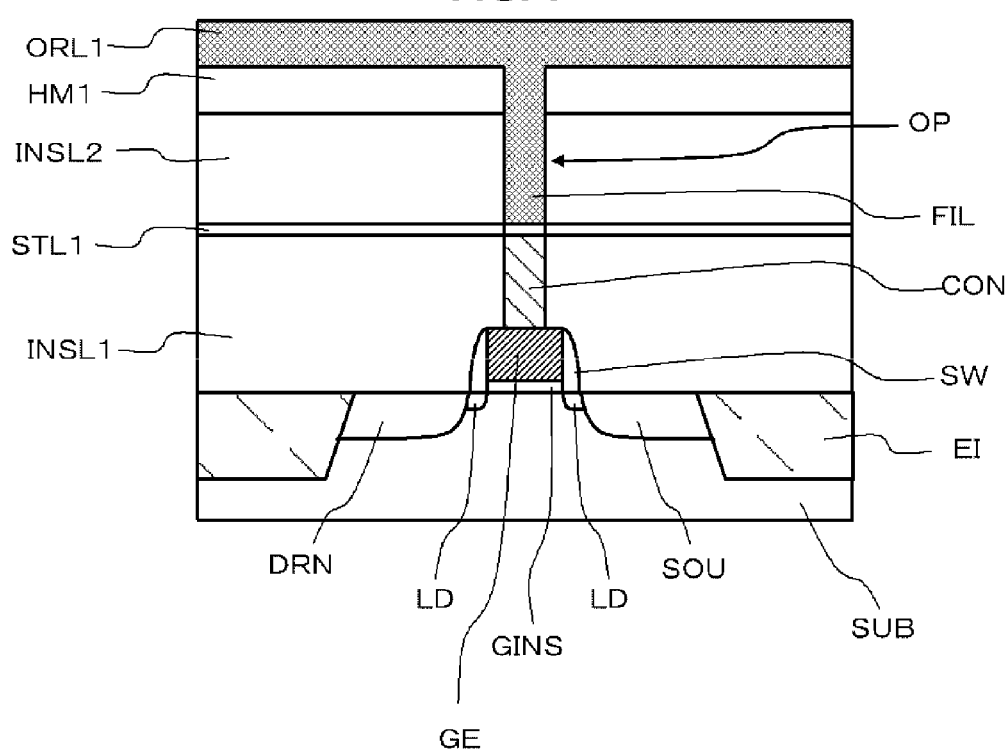
FIG. 8 is a cross-sectional view for explaining the method of manufacturing the semiconductor device.

Next, as illustrated in FIG. 8, an organic film ORL1 is formed over the hard mask HM1 and within the opening OP. The portion of the organic film ORL1, which is located within the opening OP, serves as a filling member FIL. The organic film ORL1 is a photosensitive insulating material such as, for example, a resist film.

Figure 9:
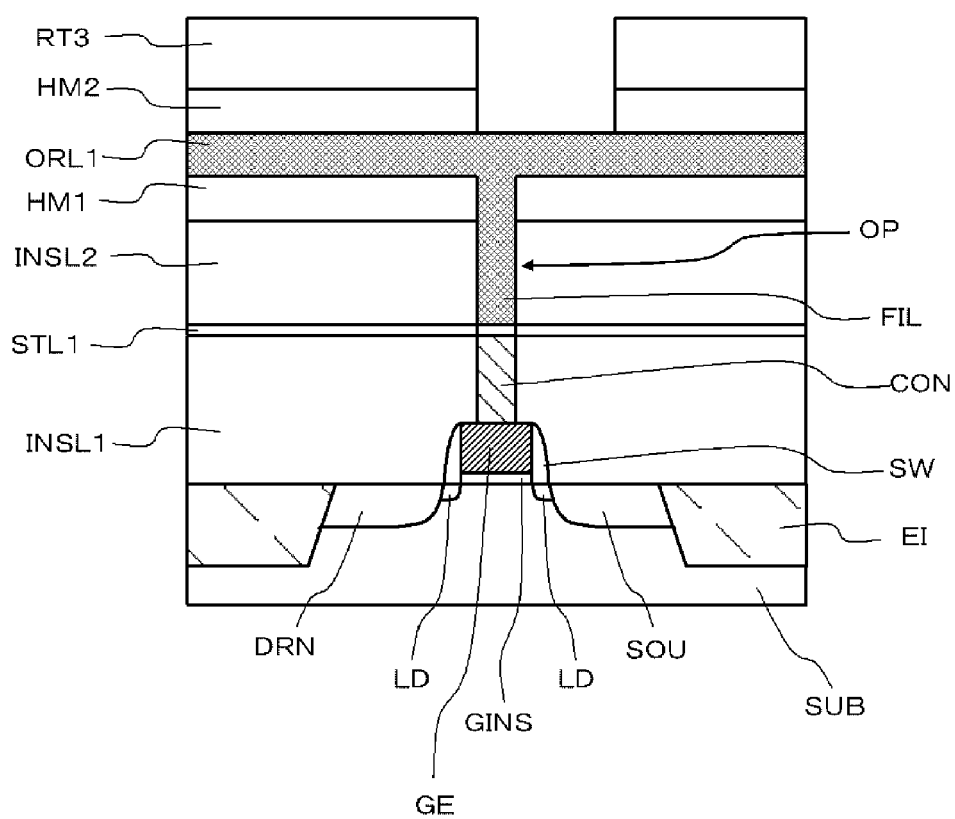
FIG. 9 is a cross-sectional view for explaining the method of manufacturing the semiconductor device.

Next, as illustrated in FIG. 9, a hard mask HM2 is formed over the organic film ORL1. Subsequently, a resist film RT3 is formed. Then, the resist film RT3 is exposed and developed. Because of this, an opening pattern is formed in the resist film RT3. The planar shape of the opening pattern is the same as the planar shape of the wiring groove GRV. After that, the hard mask HM2 is etched by using the resist film RT3 as a mask. Therefore, an opening pattern is formed in the hard mask HM2.

Figure 10:
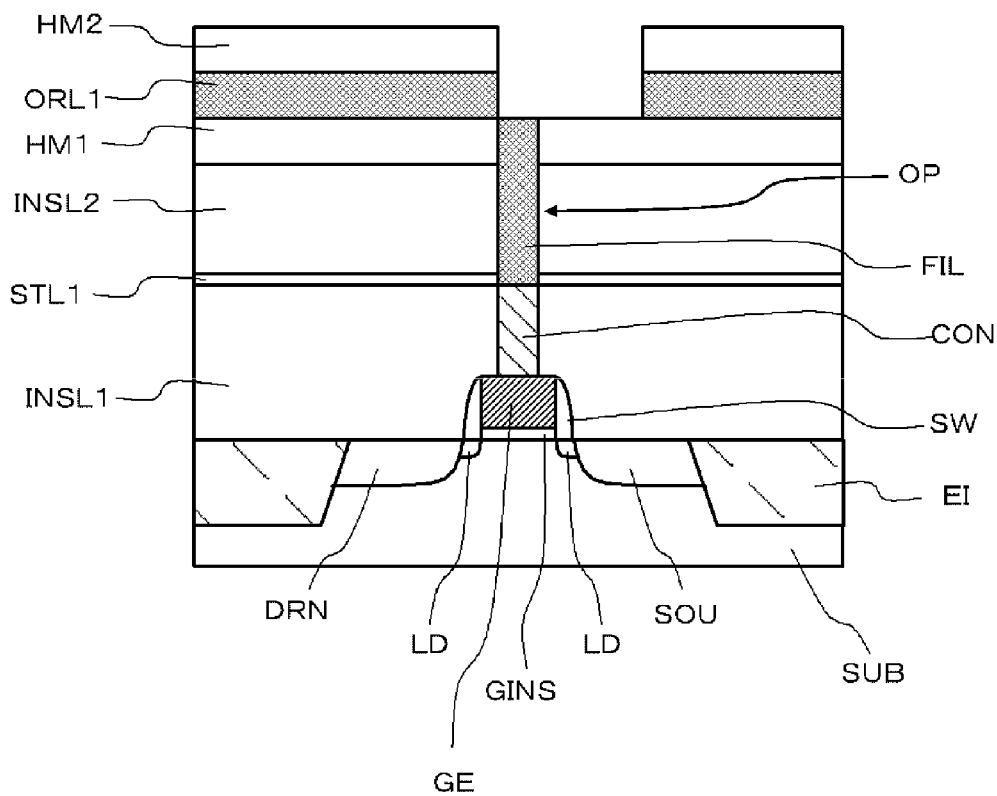
FIG. 10 is a cross-sectional view for explaining the method of manufacturing the semiconductor device.

Next, as illustrated in FIG. 10, the organic film ORL1 is processed by using the hard mask HM2 as a mask. Because of this, an opening pattern is formed in the organic film ORL1. The filling member FIL remains as it is embedded within the opening OP. The resist film RT3 is removed by the processing.

Figure 11:
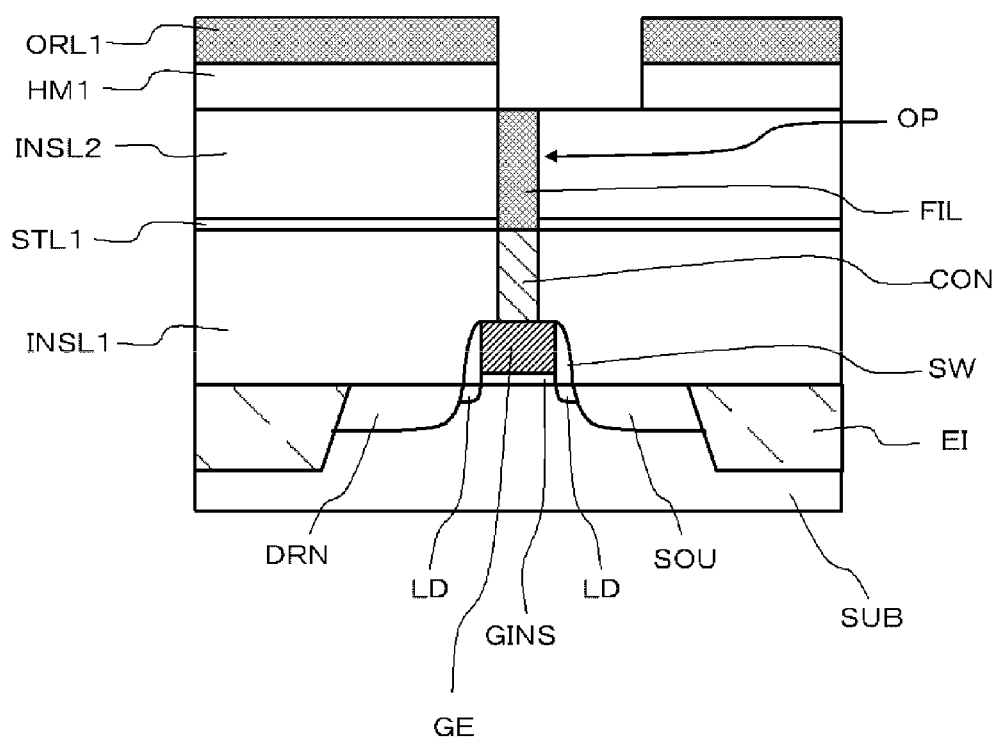
FIG. 11 is a cross-sectional view for explaining the method of manufacturing the semiconductor device.

After that, as illustrated in FIG. 11, the hard mask HM1 is etched by using the organic film ORL1 as a mask. Because of this, an opening pattern is formed in the hard mask HM1. The planar shape of the opening pattern is the same as the planar shape of the wiring groove GRV.

Figure 12:
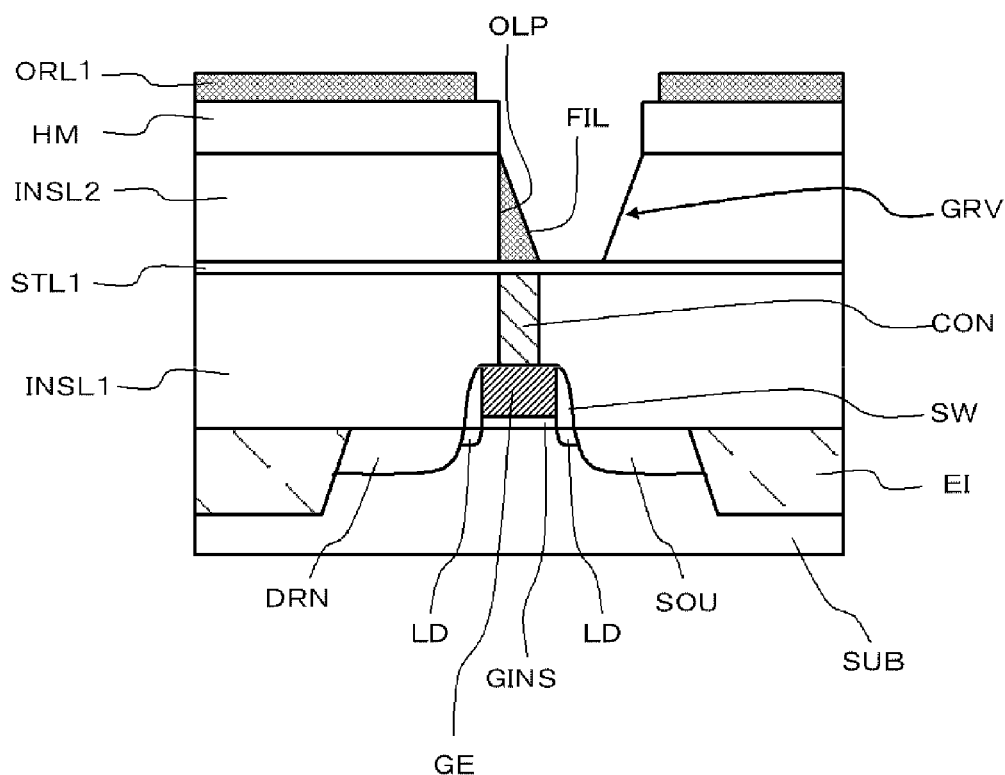
FIG. 12 is a cross-sectional view for explaining the method of manufacturing the semiconductor device.

Next, as illustrated in FIG. 12, the second interlayer insulating film INSL2 is etched by using the hard mask HM1 as a mask. Because of this, the wiring groove GRV is formed in the second interlayer insulating film INSL2. At this time, the region serving as the overlapping region OLP of the second wiring INC2, of the side surface of the wiring groove GRV is covered with the filling member FIL. Therefore, the inclination of the side surface that serves as the overlapping region OLP is more gradual than that of other portions of the side surface of the wiring groove GRV. Namely, a part of the opening OP serves as the overlapping region OLP of the side surface of the wiring groove GRV.

Figure 13:
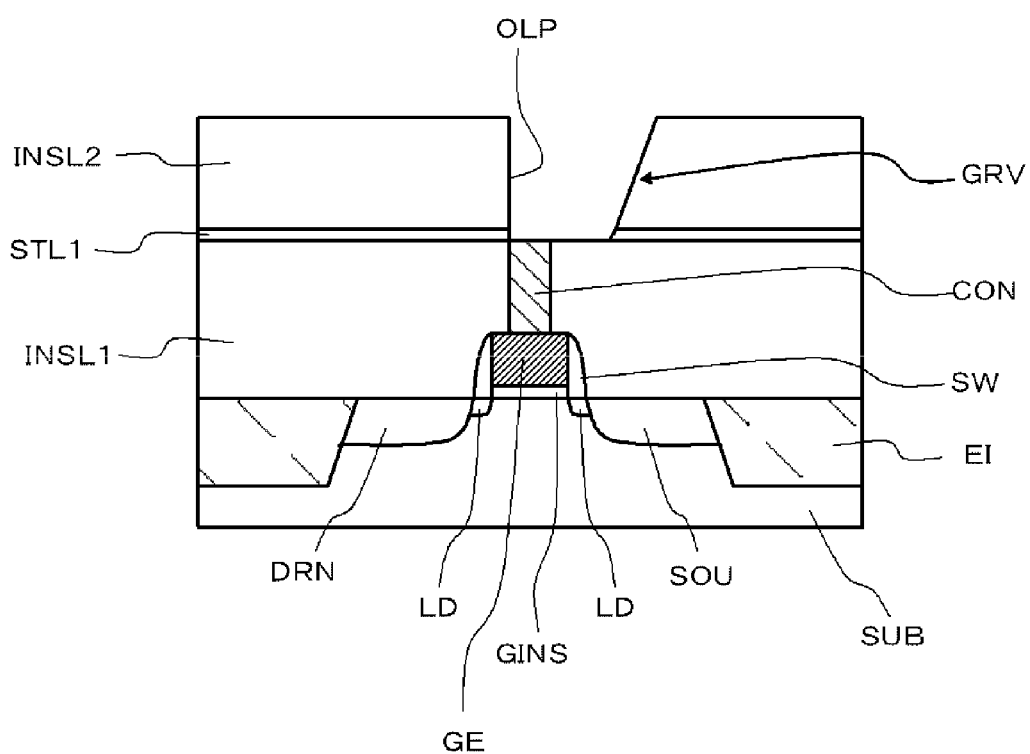
FIG. 13 is a cross-sectional view for explaining the method of manufacturing the semiconductor device.

Next, as illustrated in FIG. 13, the filling member FIL and the organic film ORL1 are removed. Because of this, the upper surface of the contact CON is exposed at the bottom surface of the wiring groove GRV.

Figure 14:
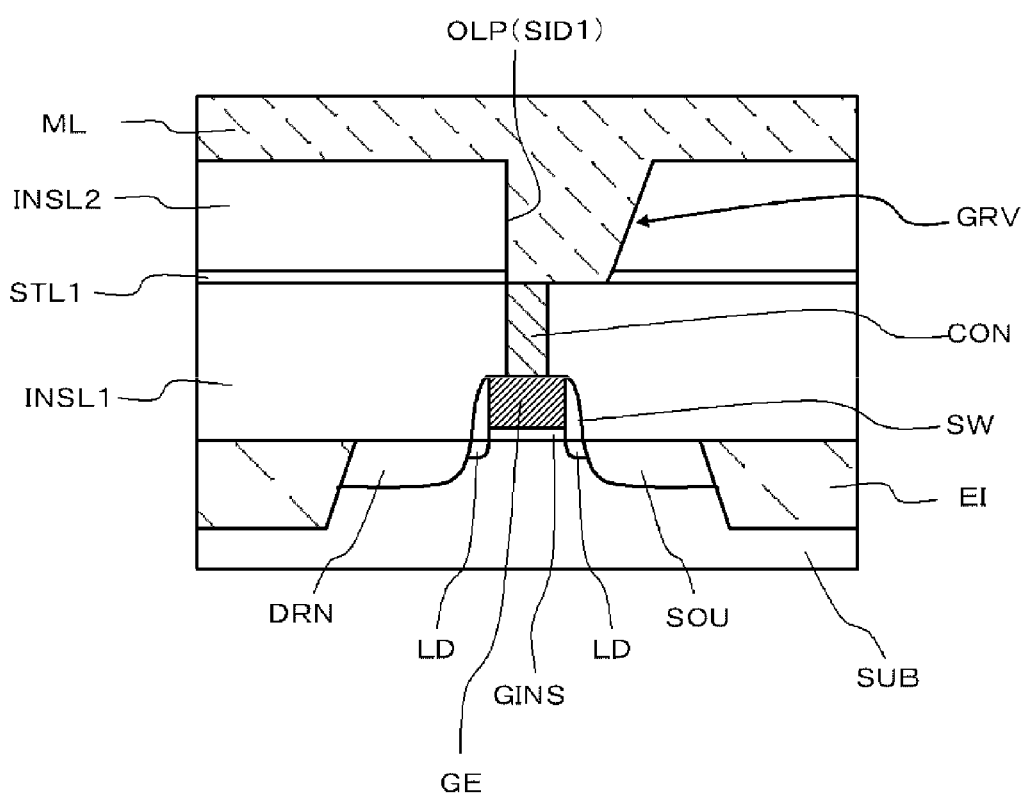
FIG. 14 is a cross-sectional view for explaining the method of manufacturing the semiconductor device.

Subsequently, as illustrated in FIG. 14, within the wiring groove GRV and over the second interlayer insulating film INSL2, a metal layer ML is formed by using, for example, the plating method. The inclination of the side surface of the wiring groove GRV is gradual except in the region serving as the overlapping region OLP of the second wiring INC2. Because of this, in the process for forming the metal layer ML, the metal layer ML is easily embedded within the wiring groove GRV.

After that, the metal layer ML located over the second interlayer insulating film INSL2 is removed by using, for example, the CMP method. In this manner, the semiconductor device SD illustrated in FIG. 1 and FIG. 2 is formed.

As described above, according to the present embodiment, the inclination of the side surface of the wiring groove GRV is gradual except in the region serving as the overlapping region OLP of the second wiring INC2. Because of this, in the process for forming the metal layer ML, the metal layer ML is easily embedded within the wiring groove GRV.

Furthermore, the overlapping region OLP of the first side surface SID1 of the second wiring INC2 has an inclination steeper than that of the second side surface SID2. Therefore, the region overlapping the contact CON, of the bottom surface BTM of the second wiring INC2 is greater in width than other portions of the bottom surface BTM. Because of this, the possibility of causing a coupling failure between the contact CON and the second wiring INC2 is low. As described above, according to the present embodiment, it is possible to simultaneously achieve both enhancement of embeddability of the wiring groove GRV and suppression of the generation of a coupling failure between the second wiring INC2 and the contact CON.

Furthermore, the opening OP is formed by using the same reticle RTC as that of the contact CON. Consequently, it is possible to reduce the manufacturing cost of the semiconductor device SD.

Moreover, in the case where a resist is used as the filling member FIL, it is possible to integrate, into one process, the process of forming a resist pattern (organic film ORL1) for forming the wiring groove GRV in the second interlayer insulating film INSL2 and the process for forming the filling member FIL. In this case, it is possible to reduce the manufacturing cost of the semiconductor device SD.

(Second Embodiment)

Figure 15:
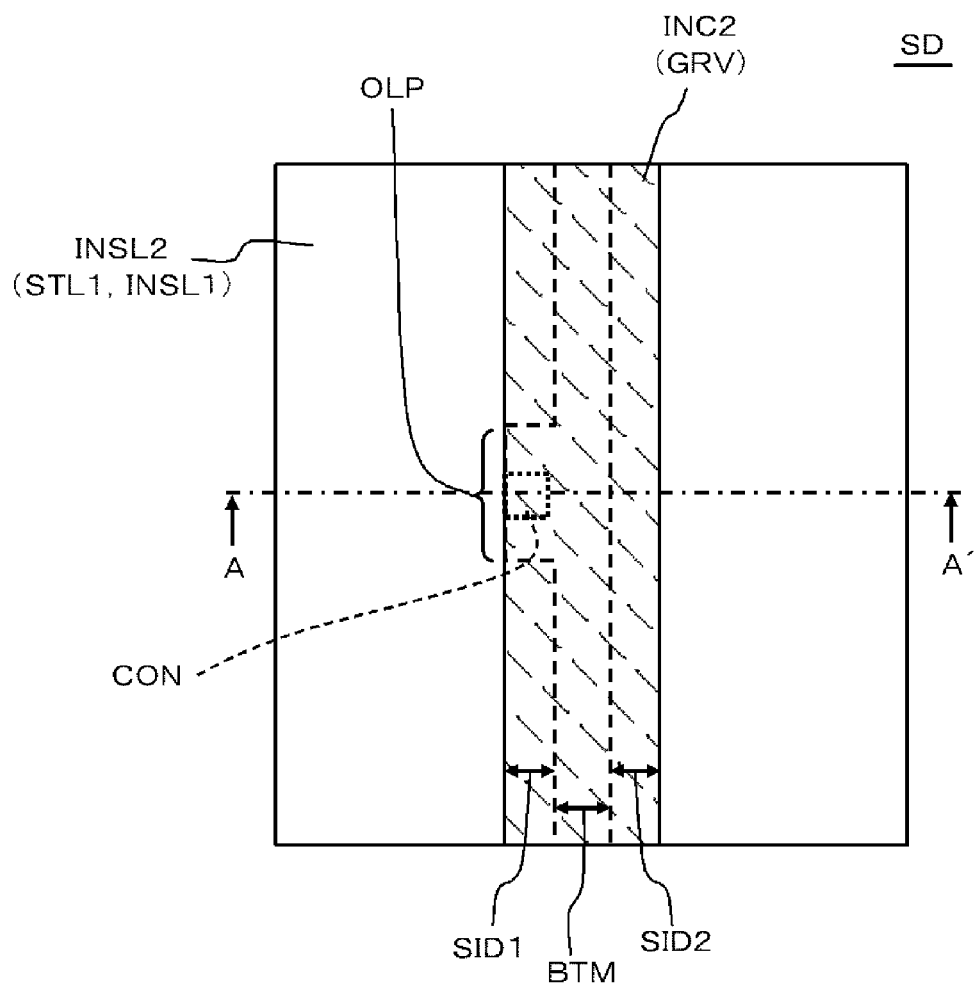
FIG. 15 is a plan view of a semiconductor device according to a Second Embodiment.

FIG. 15 is a plan view of the semiconductor device SD according to a Second Embodiment, corresponding to FIG. 2 of the First Embodiment. The configuration of the semiconductor device SD according to the present embodiment is the same as that of the semiconductor device SD according to the First Embodiment except that the length of the overlapping region OLP is greater than the width (diameter) of the contact CON in the direction in which the second wiring INC2 extends. Meanwhile, it is possible to implement such a configuration by using a reticle different from the reticle RTC when forming the opening OP.

By the present embodiment also, it is possible to simultaneously achieve both enhancement of embeddability of the wiring groove GRV and suppression of the generation of a coupling failure between the second wiring INC2 and the contact CON. In addition, the length of the overlapping region OLP is greater than the width of the contact CON, and thus it is possible to further suppress the generation of a coupling failure between the second wiring INC2 and the contact CON.

(Third Embodiment)

Figure 16:
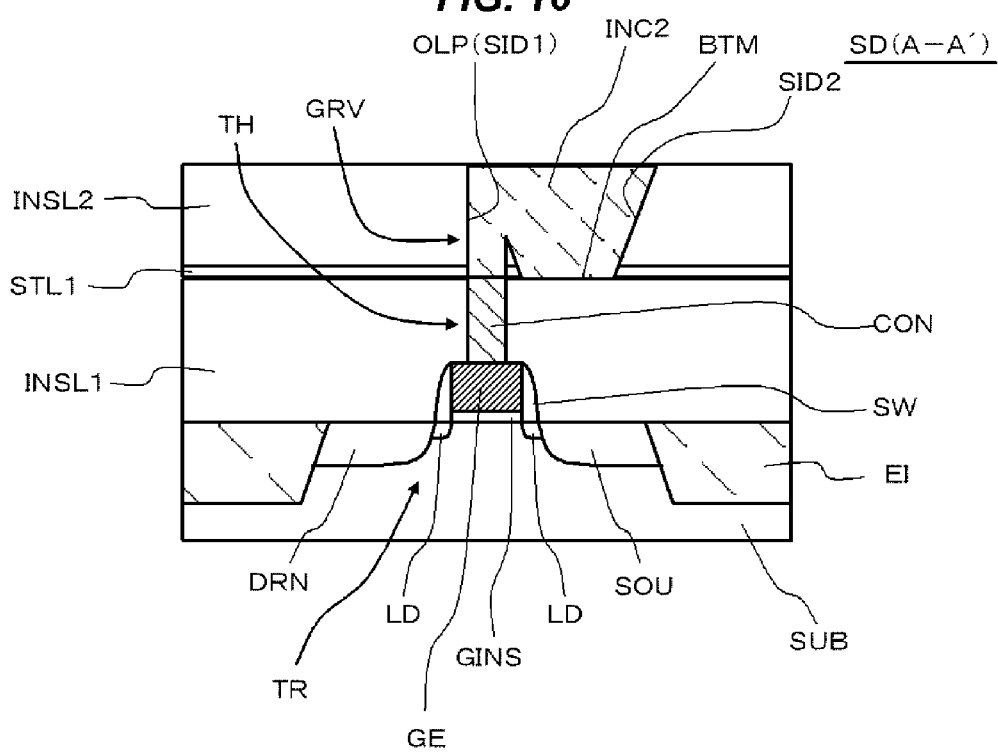
FIG. 16 is a cross-sectional view of a semiconductor device according to a Third Embodiment.
Figure 17:
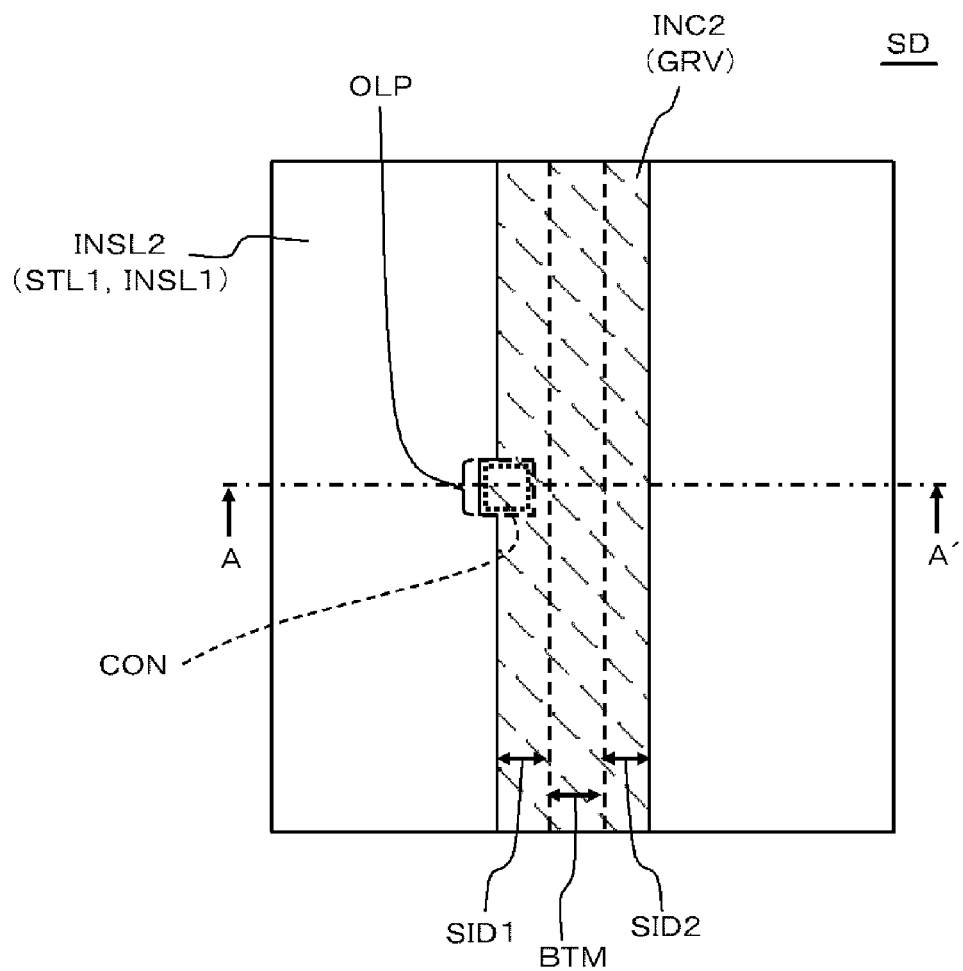
FIG. 17 is a plan view of the semiconductor device illustrated in FIG. 16.

FIG. 16 is a cross-sectional view of the semiconductor device SD according to a Third Embodiment and FIG. 17 a plan view of the semiconductor device SD illustrated in FIG. 16. The configuration of the semiconductor device SD according to the present embodiment is the same as that of the semiconductor device SD according to the First or Second Embodiment except in the following points. FIG. 17 illustrates the same case as that in the First Embodiment.

First, as illustrated in FIG. 17, in a planar view, the overlapping region OLP of the first side surface SID1 of the second wiring INC2 is located further on the outer side of the second wiring INC2 than other regions of the first side surface SID1. In addition, as illustrated in FIG. 16, in a cross-section including the overlapping region OLP, the wiring groove GRV has a shape in which only the upper parts of the normal wiring groove and a via are overlapped. Therefore, the bottom surface of the portion including the overlapping region OLP, of the lower part of the second wiring INC2 is branched into two parts. It is possible to implement such a configuration by forming the opening OP and the wiring groove GRV so that a part of the opening OP is located outside the wiring groove GRV.

Also by the present embodiment, the same effect as that of the First or Second Embodiment is obtained.

(Fourth Embodiment)

Figure 18:
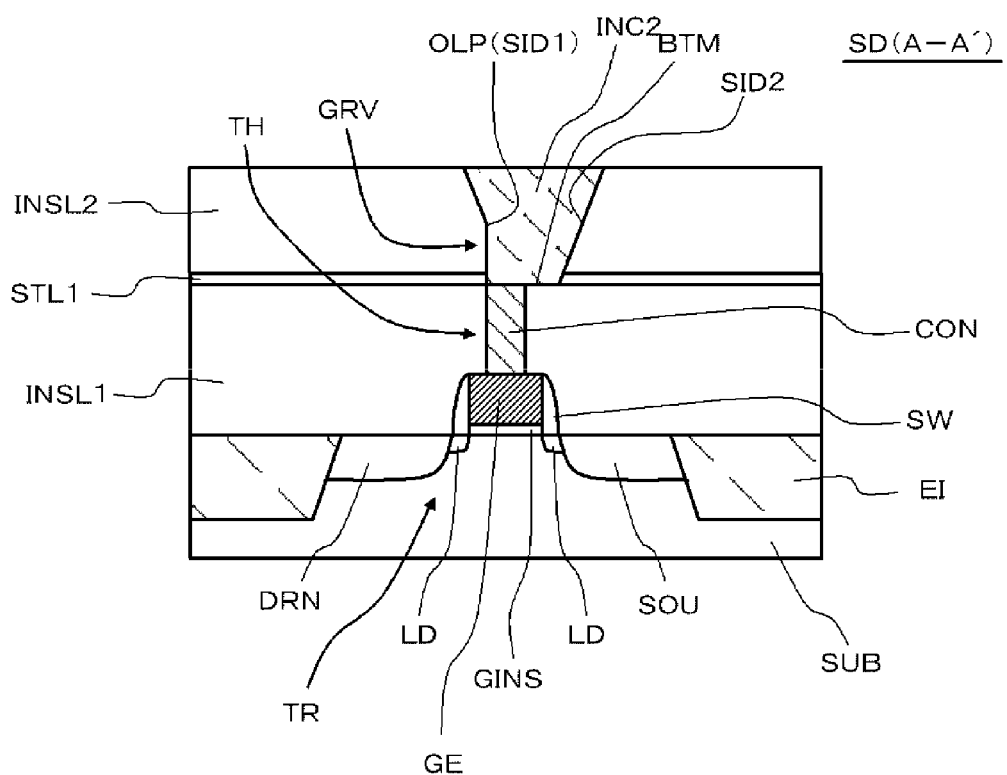
FIG. 18 is a cross-sectional view of a semiconductor device according to a Fourth Embodiment.
Figure 19:
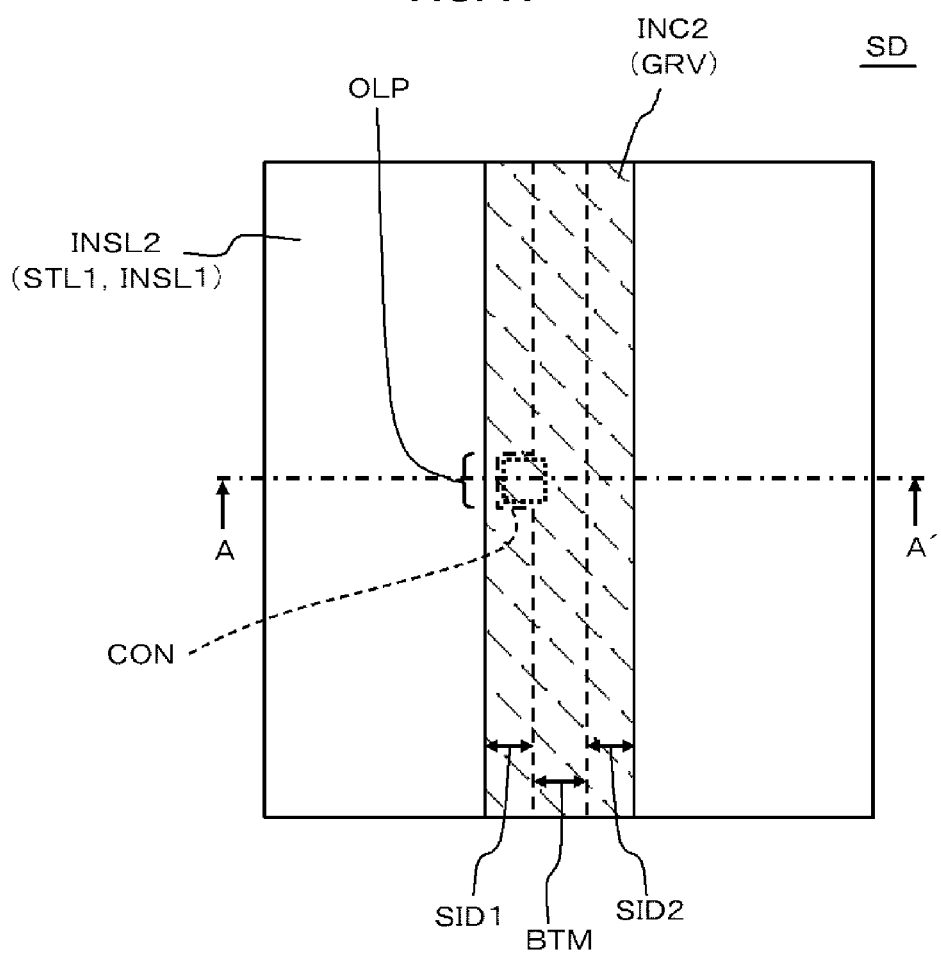
FIG. 19 is a plan view of the semiconductor device illustrated in FIG. 18.

FIG. 18 is a cross-sectional view of the semiconductor device SD according to a Fourth Embodiment and FIG. 19 is a plan view of the semiconductor device SD illustrated in FIG. 18. The semiconductor device SD according to the present embodiment has the same configuration as that of the semiconductor device SD according to the First or Second Embodiment except in the following respects. FIG. 18 illustrates the same case as that in the First Embodiment.

In the example illustrated in FIG. 18, the lower part of the overlapping region OLP of the first side surface SID1 of the second wiring INC2 has a steep inclination, but the upper part has the same inclination angle as that of the second side surface SID2. It is possible to implement such a configuration by forming the opening OP and the wiring groove GRV so that the upper part of the opening OP is located inside the wiring groove GRV.

Also by the present embodiment, the same effect as that of the First or Second Embodiment is obtained.

(Fifth Embodiment)

Figure 20:
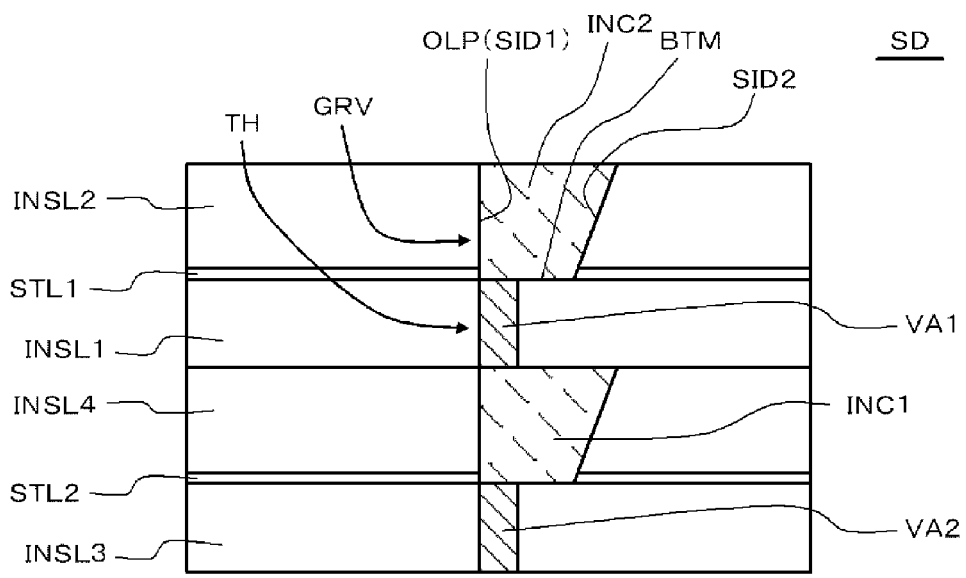
FIG. 20 is a cross-sectional view illustrating a configuration of a semiconductor device according to a Fifth Embodiment.

FIG. 20 is a cross-sectional view illustrating a configuration of the semiconductor device SD according to a Fifth Embodiment. The semiconductor device SD according to the present embodiment has the same configuration that of any of the semiconductor devices SD according to the First to Fourth Embodiments except in the following respects.

First, the second wiring INC2 is coupled to the first wiring INC1 via a via VA1 (coupling member). The via VA1 has the same configuration as that of the contact CON in the First to Fourth Embodiments.

The first wiring INC1 is, for example, a copper wiring and is embedded in an interlayer insulating film INSL4 (first interlayer insulating film). Under the interlayer insulating film INSL4, an interlayer insulating film INSL3 is formed via an etching stopper film STL2. In the interlayer insulating film INSL3, a via VA2 is embedded. The via VA2 is formed by, for example, W. The via VA2 is coupled to the bottom surface of the first wiring INC1. Then, the first wiring INC1 and the via VA2 have the single damascene structure.

In the example illustrated in FIG. 20, both the first wiring INC1 and the via VA2 also have the same configurations as those of the second wiring INC2 and the via VA1. However, the first wiring INC1 and the via VA2 may have other configurations (for example, the dual damascene structure or the general single damascene structure).

Also by the present embodiment, the same effect as that of the First or Second Embodiment is obtained.

As above, the invention made by the present inventors has been explained specifically on the basis of the embodiments, but it is needless to say that the present invention is not limited to the embodiments and various modifications are possible in the scope not departing from its gist.

What is claimed is:

1. A semiconductor device comprising:
   a first wiring;
   a first interlayer insulating film formed over the first wiring;
   a coupling hole formed in the first interlayer insulating film and located over the first wiring;
   a coupling member embedded in the coupling hole and formed of an electrically conductive material;
   a second interlayer insulating film located over the coupling member and over the first interlayer insulating film;
   a wiring groove formed in the second interlayer insulating film and overlapping the coupling member in a plan view; and
   a second wiring embedded within the wiring groove,
   wherein the coupling member extends in a first direction between the first wiring and the second wiring,
   wherein in a cross-section perpendicular to a direction passing through the coupling member and a direction in which the second wiring extends, a center of the coupling member along a second direction perpendicular to the first direction is closer to a first side surface of the second wiring than a center of the second wiring along the second direction, and wherein at least a lower part of an overlapping region that is a region where the first side surface of the second wiring overlaps the coupling member in the direction in which the second wiring extends, has an inclination steeper than that of other portions of the side surface of the second wiring.

2. The semiconductor device according to claim 1, wherein in a plan view, the overlapping region of the second wiring is located outside other regions of the first side surface of the second wiring along the second direction.

3. The semiconductor device according to claim 1, wherein the entire overlapping region has an inclination steeper than that of other portions of the side surface of the second wiring.

4. The semiconductor device according to claim 1, wherein the first wiring is a gate wiring.

5. The semiconductor device according to claim 1, wherein in the direction in which the second wiring extends, a length of the overlapping region is greater than a width of the coupling member.

6. A method of manufacturing a semiconductor device, comprising the steps of:
    forming a first interlayer insulating film over a first wiring;
    forming a coupling hole located over the first wiring in the first interlayer insulating film;
    embedding a coupling member formed of an electrically conductive material in the coupling hole;
    foaming a second interlayer insulating film over the coupling member and over the first interlayer insulating film;
    forming an opening located over the coupling member in the second interlayer insulating film;
    embedding a filling member within the opening;
    forming a mask pattern having a linear opening pattern over the second interlayer insulating film;
    forming a wiring groove by etching the second interlayer insulating film by using the mask pattern as a mask and removing the filling member; and
    embedding a second wiring in the wiring groove,
    wherein the coupling member extends in a first direction between the first wiring and the second wiring,
    wherein in the step of forming the opening pattern:
        the opening pattern overlaps at least a part of the filling member in a plan view; and
        in a cross-section perpendicular to a direction passing through the coupling member and a direction in which the opening pattern extends, a center of the coupling member along a second direction perpendicular to the first direction is closer to a first side surface of the opening pattern than a center of the opening pattern along the second direction.

7. The method of manufacturing a semiconductor device according to claim 6, wherein the filling member is a resist.

8. The method of manufacturing a semiconductor device according to claim 6, wherein a reticle used in the step of forming the coupling hole in the first interlayer insulating film is identical to a reticle used in the step of forming the opening in the second interlayer insulating film.

\* \* \* \* \*